US007683722B2

(12) United States Patent
Rofougaran

(10) Patent No.: US 7,683,722 B2
(45) Date of Patent: Mar. 23, 2010

(54) METHOD AND SYSTEM FOR SIGNAL GENERATION VIA A PLL WITH DDFS FEEDBACK PATH

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 97 days.

(21) Appl. No.: 11/863,531

(22) Filed: Sep. 28, 2007

(65) Prior Publication Data

US 2009/0085673 A1 Apr. 2, 2009

(51) Int. Cl.
*H03L 7/00* (2006.01)

(52) U.S. Cl. .......................... 331/16; 331/1 A; 331/34; 327/156

(58) Field of Classification Search ................ 331/1 A, 331/34, 16; 327/156; 455/260
See application file for complete search history.

(56) References Cited

U.S. PATENT DOCUMENTS 5,130,671 A * 7/1992 Shahriary et al. ............. 331/16
6,069,505 A 5/2000 Babanezhad
6,198,353 B1 3/2001 Janesch et al.
6,366,174 B1 * 4/2002 Berry et al. .................. 331/78
6,628,163 B2 9/2003 Dathe et al.
6,646,581 B1 11/2003 Huang
6,842,710 B1 1/2005 Gehring et al.
7,046,098 B2 5/2006 Staszewski
7,356,423 B2 4/2008 Nehrig
2005/0253646 A1 11/2005 Lin
2008/0258806 A1 10/2008 Youssoufian et al.

* cited by examiner

*Primary Examiner*—Arnold Kinkead
(74) *Attorney, Agent, or Firm*—McAndrews, Held & Malloy, Ltd.

(57) ABSTRACT

Aspects of a method and system for signal generation via a PLL with a DDFS feedback path are provided. In this regard, a phase difference between a reference signal and a feedback signal may be utilized to control a VCO, wherein the feedback signal is generated by a DDFS. Voltage, current and/or power levels of the generated feedback signal may be limited to a determined range of values. Moreover, the feedback signal may be based on an output of the VCO and a digital control word input to the DDFS. The digital control word may be programmatically controlled by, for example, a processor. Additionally, the control word may be determined based on a desired frequency of the generated feedback signal and a desired output frequency of the VCO. Accordingly, the DDFS may be clocked by the output of the VCO, or by a divided down version of the VCO output.

21 Claims, 5 Drawing Sheets

METHOD AND SYSTEM FOR SIGNAL GENERATION VIA A PLL WITH DDFS FEEDBACK PATH

CROSS-REFERENCE TO RELATED APPLICATIONS/INCORPORATION BY REFERENCE

Not Applicable

FIELD OF THE INVENTION

Certain embodiments of the invention relate to signal processing. More specifically, certain embodiments of the invention relate to a method and system for signal generation via a PLL with a DDFS feedback path.

BACKGROUND OF THE INVENTION

As wireless communications continue to evolve and become increasingly relied upon for the conveyance of data, new challenges continue to face wireless system designers. In this regard, the increasing number of wireless technologies and wireless devices has led to increasing congestion in many frequency bands. Accordingly, efforts exist to utilize less congested frequency bands. For example, in 2001, the Federal Communications Commission (FCC) designated a large contiguous block of 7 GHz bandwidth for communications in the 57 GHz to 64 GHz spectrum. This frequency band was designated for use on an unlicensed basis, that is, the spectrum is accessible to anyone, subject to certain basic, technical restrictions such as maximum transmission power and certain coexistence mechanisms. The communications taking place in this band are often referred to as '60 GHz communications'. However, in order to transmit, receive, and/or process signals with such high frequencies as 60 GHz, new methods and systems for signal generation are necessary. In this regard, conventional methods of signal generation, such as integer-N and Fractional-N phase locked loops may be difficult or costly to implement as frequencies increase.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for signal generation via a PLL with a DDFS feedback path, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for signal generation via a PLL with a DDFS feedback path. In this regard, a phase difference between a reference signal and a feedback signal may be utilized to control a VCO, wherein the feedback signal is generated by a DDFS. Voltage, current and/or power levels of the generated feedback signal may be limited to a determined range of values. Moreover, the feedback signal may be based on an output of the VCO and a digital control word input to the DDFS. The digital control word may be programmatically controlled by, for example, a processor. Additionally, the control word may be determined based on a desired frequency of the generated feedback signal and a desired output frequency of the VCO. Accordingly, the DDFS may be clocked by the output of the VCO, or by a divided down version of the VCO output. In this regard, the divisor of the frequency division may be programmatically controlled by, for example, a processor.

Figure 1:
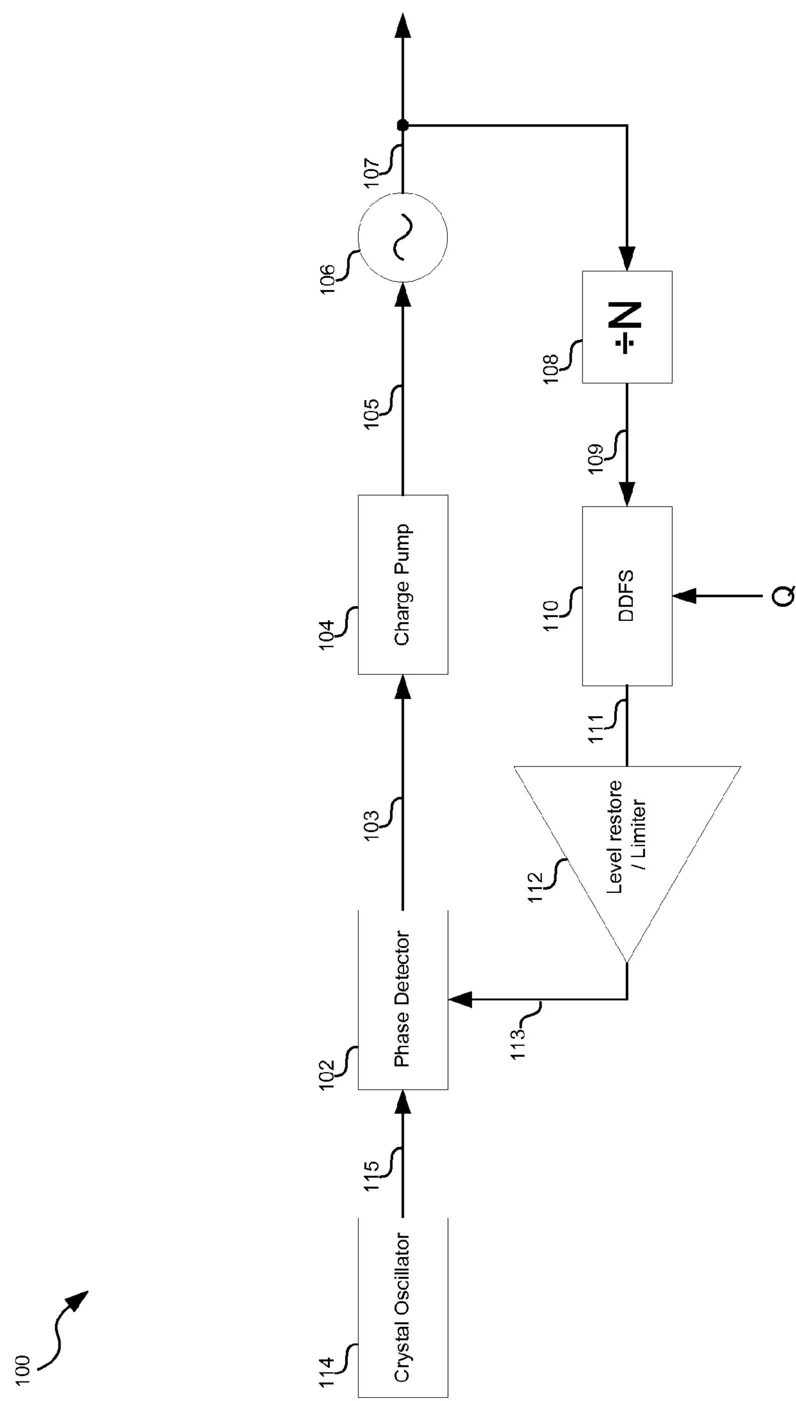
FIG. 1 is a block diagram illustrating an exemplary PLL with a DDFS in the feedback path, in accordance with an embodiment of the invention.

FIG. 1 is a block diagram illustrating an exemplary PLL with a DDFS in the feedback path, in accordance with an embodiment of the invention. Referring to FIG. 1 an exemplary local oscillator generator (LOGEN) 100 may comprise a crystal oscillator 114, a phase detector 102, a charge pump 104, a voltage controlled oscillator (VCO) 106, a frequency divider 108, a DDFS 110, and a level restoration/limiting block 112.

The crystal oscillator 114 may comprise suitable logic, circuitry, and/or code that may enable generating a stable reference frequency.

The phase detector 102 may comprise suitable logic, circuitry, and/or code that may enable generating one or more signals based on a phase difference between two signals. In this regard, the signals 113 and 115 may be input to the phase detector 102 and the signal 103 may be output. Accordingly, the signal 103 may be based on a phase difference between the signals 113 and 115. In various embodiments of the invention, the phase detector 102 may perform a multiplication of the signals 113 and 115 and the signal 103 may be a product of the multiplication. In this regard, the average voltage of the signal 103 may be proportional to the phase difference between the signals 113 and 115. In this regard, a constant 90° offset may be added to the signal 113 or the signal 115 such that when the signals 113 and 115 are in-phase, the product (signal 103) may have an average voltage of 0 volts.

The charge pump 104 may comprise suitable logic, circuitry, and/or code that may enable adjusting a control voltage 105 of the VCO 106 based on the error signal 103. For example, the charge pump 104 may increase the voltage 105 when the error signal 103 indicates that signal 113 is lagging the signal 115. Similarly, the charge pump 104 may decrease the voltage 105 when the error signal 103 indicates that signal 113 is leading the signal 115.

The VCO 106 may comprise suitable logic, circuitry, and/or code that may enable generating a signal 107 based on a control voltage 105. In this regard, the frequency of the signal 107 may be determined, at least in part, by the voltage 105.

The frequency divider 108 may comprise suitable logic, circuitry, and/or code for receiving a first, higher, frequency and outputting a second, lower, frequency. The scaling factor, N, may be determined based on one or more control signals from, for example, the processor 525 of FIG. 5.

Figure 3:
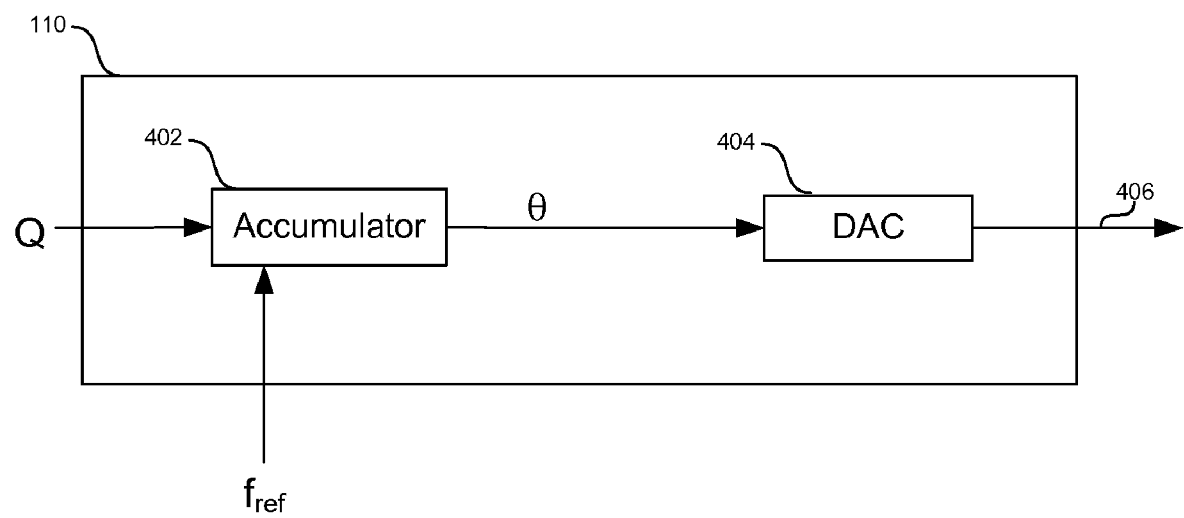
FIG. 3 is a block diagram of a direct digital frequency synthesizer, in accordance with an embodiment of the invention.

The DDFS 110 may comprise suitable logic, circuitry, and/or code that may enable generation of signals based on a digital control word and a reference signal. The control word may be generated by the processor 525 or the processor 529 of FIG. 5. FIG. 3 illustrates details of an exemplary DDFS block.

The level restoration/limiting block 112 may comprise suitable logic, circuitry, and/or code that may enable receiving signals of variable amplitude and outputting signals of a constant amplitude. For example, the level restoration/limiting block 112 may output the signal 113 based on the signal 111. In this regard, 113 may have the same frequency and/or phase of the signal 111 but may swing full-scale regardless of the amplitude of the signal 111. The level restoration/limiting block 112 may be configurable such that power, voltage, and/or current of the signals 113 may be adjustable.

In operation the LOGEN 100 may generate a signal 107 of variable frequency, which has the stability of the fixed frequency reference signal 115 from the crystal oscillator 114. In this regard, the DDFS 110 may enable generation of a signal 111 which may be equal in frequency to the reference signal 115, based on the signal 109 and the control word Q. Accordingly, the output signal 107 may be any integer or fractional multiple of the reference signal 115. In this regard, the signal 111 may be determined using $$f_{111} = \frac{f_{107}}{N} \cdot Q \cdot \frac{1}{2^{n-1}} \quad \text{EQ. 1}$$

where $f_{111}$ is the frequency of the signal 111, $f_{107}$ is the frequency of the signal 107, N is the divide ratio of the frequency divider 108, Q is the value of the control word input to the DDFS 110, and $2^{n-1}$ is the highest value the DDFS can store. Accordingly, the LOGEN 100 may be enabled to generate a wide range of frequencies, with high resolution, without the need of a traditional fractional-N synthesizer.

Figure 2:
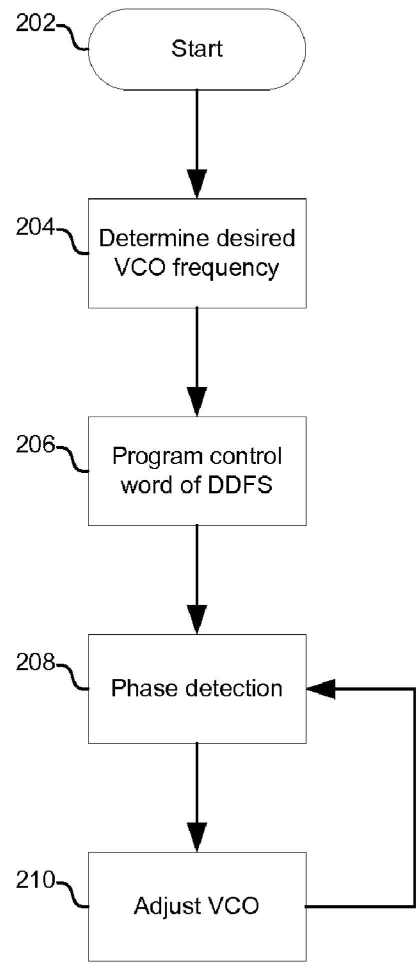
FIG. 2 is a flow chart illustrating exemplary steps for generating a signal via a PLL with DDFS feedback path, in accordance with an embodiment of the invention.

FIG. 2 is a flow chart illustrating exemplary steps for generating a signal via a PLL with DDFS feedback path, in accordance with an embodiment of the invention. Referring to FIG. 2, the exemplary steps may begin with start step 202. Subsequent to start step 202, the exemplary steps may advance to step 204. In step 204, a desired frequency to be output by the VCO 106 may be determined. In this regard, if the LOGEN 100 is being utilized to transmit or receive RF signals, then the output of the VCO 106 may be determined based on the RF transmit and/or RF receive frequency. Subsequent to step 204, the exemplary steps may advance to step 206. In step 206, the digital control word input to the DDFS 110 may be determined. In this regard, the value of the digital control word may be determined utilizing EQ. 1 above. Accordingly, for different values of the reference frequency 115 and/or the desired output frequency 107, the value of the digital output word may be adjusted. In this regard, a processor, such as the processor 525 or the processor 529 of FIG. 5, may programmatically control the value of the digital control word. Subsequent to step 206, the exemplary steps may advance to step 208. In step 208, a phase difference between the signal 113 and the signal 115 may be determined. Subsequent to step 208, the exemplary steps may advance to step 210. In step 210, the VCO 106 may be adjusted based on the phase difference between the signals 113 and 115. For example, the voltage across a varactor may be adjusted to increase or decrease the output frequency of the VCO 106, such that the phase difference between the signals 113 and 115 may be reduced. Accordingly, when there may be no phase difference between the signals 113 and 115 the PLL may be said to be "locked". Subsequent to step 210, the exemplary steps may return to step 208. In this regard, maintaining phase lock may be a continuous process that requires periodic or even constant feedback.

FIG. 3 is a block diagram of a direct digital frequency synthesizer, in accordance with an embodiment of the invention. Referring to FIG. 3, the DDFS block 110 may comprise an accumulator 402 and a digital-to-analog conversion (DAC) block 404.

The accumulator 402 may comprise suitable logic, circuitry, and/or code that may enable successively adding a control word Q to a value stored in the accumulator on each cycle of a reference clock. The accumulator may receive the control word Q from a processor, such as the processor 525 described in FIG. 5. The accumulator 402 may also receive a reference signal, $f_{ref}$. In this regard, the control word Q and the reference signal $f_{ref}$ may determine a phase and/or a frequency of the output signal 406.

The DAC block 404 may comprise suitable logic, circuitry, and/or code that may enable output of a signal of varying phase, frequency, or amplitude. In one embodiment or the invention, the DAC block 404 may comprise a number of lookup tables used to generate output signals, which may drive one or more power amplifiers, such as the amplifier 408 described in FIG. 4.

In operation, the DDFS block 110 may be a digitally-controlled signal generator that may vary a phase, a frequency, and/or an amplitude of one or more output signals based on a single fixed-frequency reference clock, $f_{ref}$, and a control word Q. In operation, the control word may be provided to the accumulator 402, and may be successively added to a value stored in the accumulator on each cycle of the signal 109. In this manner, the sum will eventually be greater than the maximum value the accumulator may store, and the value in the accumulator may overflow or "wrap". Accordingly, an N-bit accumulator will overflow at a frequency $f_o$ given by EQ. 2.

$$f_o = f_{ref}(Q/2^N) \quad \text{EQ. 2}$$

In this manner, the output of the accumulator, θ, may be periodic with period $1/f_o$ and may represent the phase angle of a signal. Providing this phase angle to the DAC block 404 may then allow generation of one or more signals of varying phase, frequency and amplitude. In this regard, the DDFS block 110 may be well suited as a frequency generator that outputs one or more sine waves or other periodic waveforms over a large range of frequencies, from almost DC to approximately half the reference clock frequency $f_{ref}$.

Figure 4:
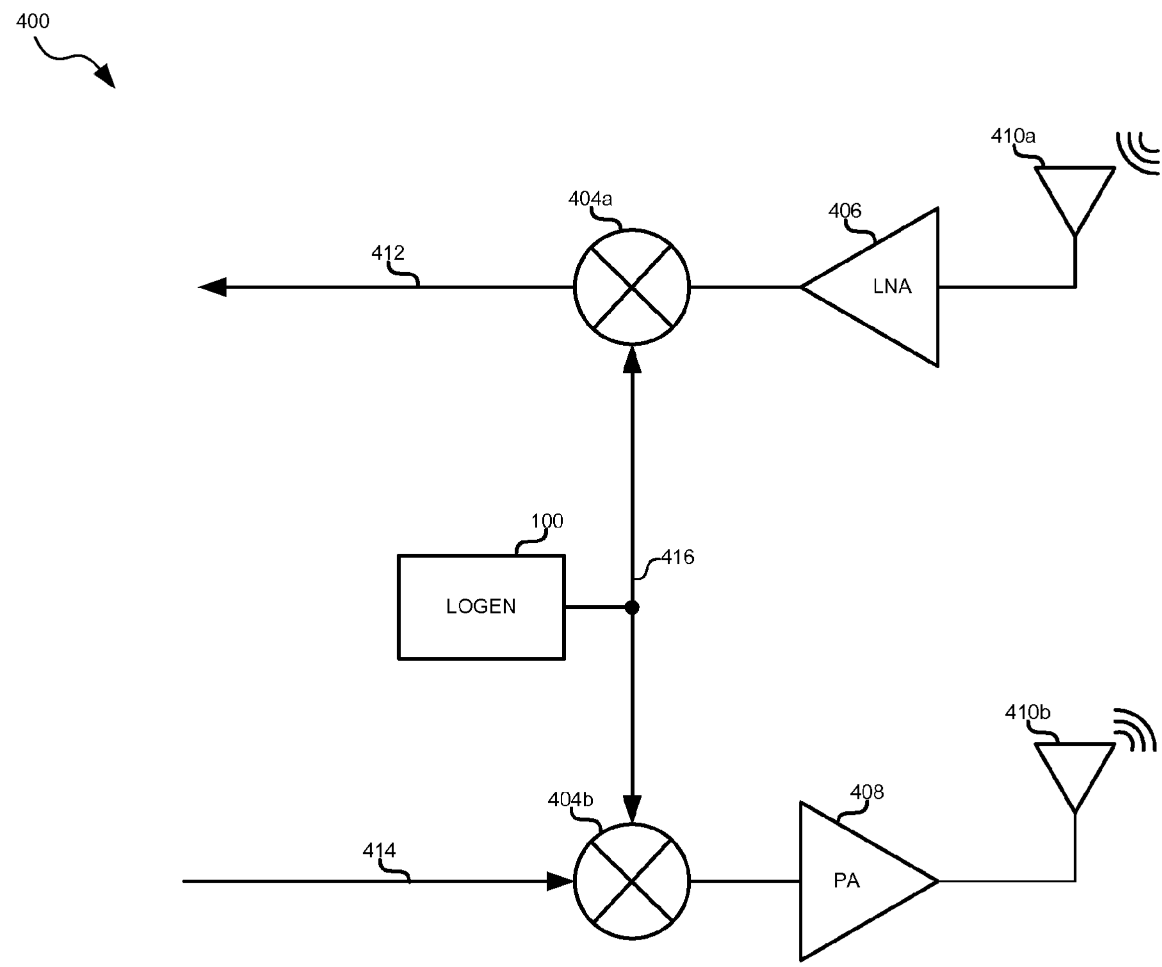
FIG. 4 is a diagram of a transceiver, in accordance with an embodiment of the invention.

FIG. 4 is a diagram of a transceiver, in accordance with an embodiment of the invention. Referring to FIG. 4 there is shown a transceiver 400 which may be all or a portion of the RF receiver 523*a*, for example. The transceiver 400 may comprise local oscillator generator (LOGEN) 100, mixers 404*a* and 404*b*, a low noise amplifier (LNA) 406, a power amplifier 408, antennas 410*a* and 410*b*, and PA calibration block 412.

The LOGEN 100 may comprise suitable logic, circuitry, and/or code that may enable generating a reference signal. In this regard, the LOGEN 100 may comprise a phase locked loop (PLL) which may have a direct digital frequency synthesizer (DDFS) in a feedback path. In an exemplary embodiment, of the invention, the transceiver 400 may directly convert between RF and baseband. Accordingly, the frequency of the signal 416, $F_{LO}$, may be ($F_{RF} \pm F_{baseband}$).

The mixer 404*a* may comprise suitable logic, circuitry, and/or code that may enable generation of inter-modulation products resulting from mixing the output of the LNA 406 and the LO signal 416. Similarly, the mixer 404*b* may comprise suitable logic, circuitry, and/or code that may enable generation of inter-modulation products resulting from mixing the baseband signal 414 and the LO signal 416. In various embodiments of the invention the output of the mixers may be filtered such that desired inter-modulation products are passed with less attenuation than undesired inter-modulation products.

The LNA 406 may comprise suitable logic, circuitry, and/or code that may enable buffering and/or amplification of received RF signals. In this regard, the gain of the LNA 406 may be adjustable to enable reception of signals of varying strength. Accordingly, the LNA 406 may receive one or more control signals from a processor such as the processors 525 and 529 of FIG. 5.

The PA 408 may comprise suitable logic, circuitry, and/or code that may enable buffering and/or amplification of a RF signal and outputting the signal to an antenna for transmission. In this regard, the gain of the PA 408 may be adjustable and may enable transmitting signals of varying strength. Accordingly, the PA 408 may receive one or more control signals from a processor such as the processors 525 and 529 of FIG. 5.

The antennas 410*a* and 410*b* may comprise suitable logic, circuitry, and/or code that may enable reception and/or transmission of signals of up to EHF. In various embodiments of the invention there may be separate transmit and receive antennas, as depicted, or there may be a single antenna for both transmit and receive functions.

In an exemplary receive operation, RF signals may be received by the antenna 410*a* and may be conveyed to the LNA 406. The LNA 406 may amplify the received signal and convey it to the mixer 404*a*. In this regard, the gain of the LNA may be adjusted based on received signal strength. Additionally, the gain may be controlled via one or more control signals from, for example, a processor such as the processors 525 and 529 of FIG. 5. The LO signal 416 may be coupled to the mixer 404*a* such that the received signal of frequency $F_{RF}$ may be down-converted to a baseband signal 412. The baseband signal 412 may be conveyed, for example, to a baseband processor such as the baseband processor 529 of FIG. 5.

In an exemplary transmit operation, a baseband signal 414 may be conveyed to the mixer 404*b*. The LO signal 416 may be coupled to the mixer 404*b* and the baseband signal 414, of frequency $F_{baseband}$, may be up-converted to RF. The RF signal may be conveyed to the PA 408 for transmission via the antenna 410*b*. In this regard, the gain of the PA 408 may be adjusted via one or more control signals from, for example, a processor such as the processors 525 and 529 of FIG. 5.

Figure 5:
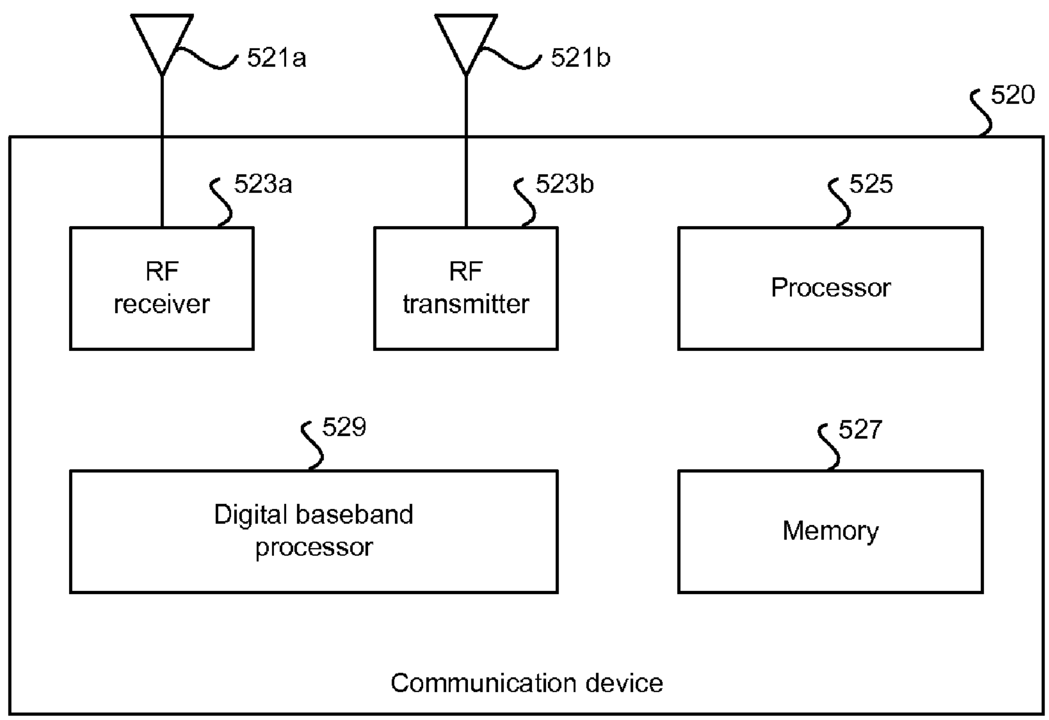
FIG. 5 is a block diagram illustrating an exemplary RF communication device, in accordance with an embodiment of the invention.

FIG. 5 is a block diagram illustrating an exemplary RF communication device, in accordance with an embodiment of the invention. Referring to FIG. 5, there is shown a RF communication device 520 that may comprise an RF receiver 523*a*, an RF transmitter 523*b*, a digital baseband processor 529, a processor 525, and a memory 527. A receive antenna 521*a* may be communicatively coupled to the RF receiver 523*a*. A transmit antenna 521*b* may be communicatively coupled to the RF transmitter 523*b*. The RF communication device 520 may be operated in a system, such as the cellular network and/or digital video broadcast network, for example.

The RF receiver 523*a* may comprise suitable logic, circuitry, and/or code that may enable processing of received RF signals. In this regard, the receiver may be enabled to generate signals, such as local oscillator signals, for the reception and processing of RF signals. The RF receiver 523*a* may down-convert received RF signals to a baseband frequency signal. The RF receiver 523*a* may perform direct down-conversion of the received RF signal to a baseband frequency signal, for example. In some instances, the RF receiver 523*a* may enable analog-to-digital conversion of the baseband signal components before transferring the components to the digital baseband processor 529. In other instances, the RF receiver 523*a* may transfer the baseband signal components in analog form.

The digital baseband processor 529 may comprise suitable logic, circuitry, and/or code that may enable processing and/or handling of baseband frequency signals. In this regard, the digital baseband processor 529 may process or handle signals received from the RF receiver 523*a* and/or signals to be transferred to the RF transmitter 523*b*. The digital baseband processor 529 may also provide control and/or feedback information to the RF receiver 523*a* and to the RF transmitter 523*b* based on information from the processed signals. The digital baseband processor 529 may communicate information and/or data from the processed signals to the processor 525 and/or to the memory 527. Moreover, the digital baseband processor 529 may receive information from the processor 525 and/or to the memory 527, which may be processed and transferred to the RF transmitter 523*b* for transmission to the network.

The RF transmitter 523*b* may comprise suitable logic, circuitry, and/or code that may enable processing of RF signals for transmission. In this regard, the transmitter may be enabled to generate signals, such as local oscillator signals, for the transmission and processing of EHF signals. The RF transmitter 523*b* may up-convert the baseband frequency signal to an RF signal. The RF transmitter 523*b* may perform direct up-conversion of the baseband frequency signal to a RF signal of approximately 60 GHz, for example. In some instances, the RF transmitter 523*b* may enable digital-to-analog conversion of the baseband signal components received from the digital baseband processor 529 before up conversion. In other instances, the RF transmitter 523*b* may receive baseband signal components in analog form.

The processor 525 may comprise suitable logic, circuitry, and/or code that may enable control and/or data processing operations for the RF communication device 520. The processor 525 may be utilized to control at least a portion of the RF receiver 523*a*, the RF transmitter 523*b*, the digital baseband processor 529, and/or the memory 527. In this regard, the processor 525 may generate at least one signal for controlling operations within the RF communication device 520. The processor 525 may also enable executing of applications that may be utilized by the RF communication device 520. For example, the processor 525 may execute applications that may enable displaying and/or interacting with content received via RF signals in the RF communication device 520.

The memory 527 may comprise suitable logic, circuitry, and/or code that may enable storage of data and/or other information utilized by the RF communication device 520. For example, the memory 527 may be utilized for storing processed data generated by the digital baseband processor 529 and/or the processor 525. The memory 527 may also be utilized to store information, such as configuration information, that may be utilized to control the operation of at least one block in the RF communication device 520. For example, the memory 527 may comprise information necessary to configure the RF receiver 523*a* to enable receiving signals in the appropriate frequency band.

Aspects of a method and system for signal generation via a PLL with a DDFS feedback path are provided. In this regard, a phase difference between a reference signal, such as the signal 115, and a feedback signal, such as the signal 113, may be utilized to control a VCO, such as the VCO 106, wherein the feedback signal is generated by a DDFS, such as the DDFS 110. Voltage, current and/or power levels of the generated feedback signal may be limited to a determined range of values, by, for example, the level restoration/limiting block 112. Moreover, the feedback signal may be based on an output of the VCO, such as the signal 107, and a digital control word, such as the word 'Q' of FIG. 1, input to the DDFS. The digital control word may be programmatically controlled by, for example, a processor. Additionally, the control word may be determined based on a desired frequency of the generated feedback signal and a desired output frequency of the VCO. Accordingly, the DDFS may be clocked by the output of the VCO, or by a divided down version of the VCO output. In this regard, the divisor of the frequency division may be programmatically controlled by, for example, a processor.

Another embodiment of the invention may provide a machine-readable storage, having stored thereon, a computer program having at least one code section executable by a machine, thereby causing the machine to perform the steps as described herein for signal generation via a PLL with a DDFS feedback path are provided.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:

generating a digital signal via a direct digital frequency synthesizer (DDFS) based on a digital control word and a voltage controlled oscillator (VCO) signal, wherein said digital control word and said VCO signal are inputs to said DDFS, and wherein said signal is generated so that a frequency of said generated signal is at least based on a value of said digital control word;

converting said generated digital signal to an analog signal;

limiting signal levels of said analog signal such that maxima of said analog signal are approximately equal to a first signal level and minima of said analog signal are approximately equal to a second signal level;

determining a phase difference between said limited analog signal and a reference signal; and controlling said VCO signal based on said determined phase difference.

2. The method according to claim 1, comprising programmatically controlling said digital control word.

3. The method according to claim 1, comprising controlling said digital control word based on a frequency of said generated signal and a frequency of said voltage controlled oscillator signal.

4. The method according to claim 1, comprising clocking said direct digital frequency synthesizer with said voltage controlled oscillator signal.

5. The method according to claim 4, comprising frequency dividing said output of said voltage controlled oscillator prior to said clocking.

6. The method according to claim 4, comprising programmatically controlling a divisor utilized for said frequency division.

7. The method according to claim 1, comprising limiting voltage, current, and/or power levels of said analog signal.

8. A machine-readable storage having stored thereon, a computer program having at least one code section for signal processing, the at least one code section being executable by a machine for causing the machine to perform steps comprising:

generating a digital signal via a direct digital frequency synthesizer (DDFS) based on a digital control word and a voltage controlled oscillator (VCO) signal, wherein said digital control word and said VCO signal are inputs to said DDFS, and wherein said signal is generated so that a frequency of said generated signal is at least based on a value of said digital control word;

converting said generated digital signal to an analog signal;

limiting signal levels of said analog signal such that maxima of said analog signal are approximately equal to a first signal level and minima of said analog signal are approximately equal to a second signal level;

determining a phase difference between said limited analog signal and a reference signal; and controlling said VCO signal based on said determined phase difference.

9. The machine-readable storage according to claim 8, wherein said at least one code section comprises code for programmatically controlling said digital control word.

10. The machine-readable storage according to claim 8, wherein said at least one code section comprises code for controlling said digital control word based on a frequency of said generated signal and a frequency of said voltage controlled oscillator signal.

11. The machine-readable storage according to claim 8, wherein said at least one code section comprises code for clocking said direct digital frequency synthesizer with said voltage controlled oscillator signal.

12. The machine-readable storage according to claim 11, wherein said at least one code section comprises code for frequency dividing said output of said voltage controlled oscillator prior to said clocking.

13. The machine-readable storage according to claim 11, wherein said at least one code section comprises code for programmatically controlling a divisor utilized for said frequency division.

14. The machine-readable storage according to claim 8, wherein said at least one code section comprises code for limiting voltage, current, and/or power levels of said analog signal.

15. A system for signal processing, the system comprising: one or more circuits that are operable to:

generate a digital signal via a direct digital frequency synthesizer (DDFS) based on a digital control word and a voltage controlled oscillator (VCO) signal, wherein said digital control word and said VCO signal are inputs to said DDFS, and wherein said signal is generated so that a frequency of said generated signal is at least based on a value of said digital control word;

convert said generated digital signal to an analog signal;

limit signal levels of said analog signal such that maxima of said analog signal are approximately equal to a first signal level and minima of said analog signal are approximately equal to a second signal level;

determine a phase difference between said limited analog signal and a reference signal; and control said VCO signal based on said determined phase difference.

16. The system according to claim 15, wherein said one or more circuits are operable to programmatically control said digital control word.

17. The system according to claim 15, wherein said one or more circuits are operable to control said digital control word based on a frequency of said generated signal and a frequency of said voltage controlled oscillator signal.

18. The system according to claim 15, wherein said one or more circuits are operable to clock said direct digital frequency synthesizer with said voltage controlled oscillator signal.

19. The system according to claim 18, wherein said one or more circuits are operable to frequency divide said output of said voltage controlled oscillator prior to said clocking.

20. The system according to claim 18, wherein said one or more circuits are operable to programmatically control a divisor utilized for said frequency division.

21. The system according to claim 15, wherein said one or more circuits are operable to limit voltage, current, and/or power levels of said analog signal.

* * * * *